United States Patent [19]

Tamura et al.

[11] 4,453,144
[45] Jun. 5, 1984

[54] LC COMPOSITE COMPONENT

[75] Inventors: Toshiaki Tamura, Neyagawa; Yoshiaki Otani, Hirakata; Hiroshi Otake, Katano; Masami Yamamura, Kadoma, all of Japan

[73] Assignee: Matsushita Electric Industrial Co., Ltd., Osaka, Japan

[21] Appl. No.: 355,550

[22] PCT Filed: May 29, 1981

[86] PCT No.: PCT/JP81/00119
§ 371 Date: Jan. 27, 1982
§ 102(e) Date: Jan. 27, 1982

[87] PCT Pub. No.: WO81/03576
PCT Pub. Date: Dec. 10, 1981

[30] Foreign Application Priority Data

Jun. 4, 1980 [JP] Japan .............................. 55-78469[U]

[51] Int. Cl.³ ............................................ H03H 1/00
[52] U.S. Cl. ..................................... 333/140; 333/185
[58] Field of Search ............... 333/140, 168, 182, 183, 333/185; 336/198; 361/417, 419, 270

[56] References Cited

U.S. PATENT DOCUMENTS

| 3,750,054 | 7/1973 | Tamura et al. | 333/140 |
| 4,074,210 | 2/1978 | Otake et al. | 333/140 X |
| 4,163,202 | 7/1979 | Tunematu et al. | 361/270 X |

Primary Examiner—Paul L. Gensler
Assistant Examiner—Benny Lee
Attorney, Agent, or Firm—Wenderoth, Lind & Ponack

[57] ABSTRACT

An LC composite component comprising a coaxial bobbin, a plurality of collars thereon defining winding grooves therebetween, coils wound in the winding grooves, each collar having a concave recess therein, open at a top end thereof, terminal pins projecting upwardly from the opposite ends of the concave recess, a leadless tip type capacitor having upwardly projecting electrodes accommodated in the concave recess and the coils and the capacitor electrodes being connected with each other by the terminal pins, the capacitor electrodes being connected to the terminal pins so as to stably and firmly secure the capacitor at the open end of the concave recess of each collar.

3 Claims, 6 Drawing Figures

LC COMPOSITE COMPONENT

FIELD OF THE INVENTION

The present invention relates to an LC composite component such as an LC filter, delay line or the like each provided with coil and a capacitor.

BACKGROUND OF THE INVENTION

Conventionally in an LC composite component such as a delay line, an LC filter or the like, a coil is wound around a coaxial bobbin. The lead wire of the capacitor is wound around a terminal pin erected on the collar of the coaxial bobbin and the portion is connected through soldering.

In LC composite components of such construction as described hereinabove, the connection of the capacitor is unreliable, since the fixing of the capacitor to the other elements depends upon the connecting strength of the lead wire upon the terminal pin. Also, the lead wire of the capacitor is wound and soldered around the terminal pin to connect and secure the capacitor. Incorporating the capacitor into such a component takes considerable labor and thus the productivity of such components is poor.

SUMMARY OF THE INVENTION

Thus, the present invention provides an LC composite component, including a coaxial bobbin, a plurality of collars thereon defining winding grooves therebetween, coils wound in the winding grooves, each collar having a concave recess therein open at a top end thereof, terminal pins projecting upwardly from the opposite ends of the concave recess, a leadless tip type capacitor having upwardly projecting electrodes accomodated in the concave recess and the coils and the capacitor electrodes being connected with each other by the terminal pins, the capacitor or electrodes being connected to the terminal pins at the open end of the concave recess of each collar to allow the capacitor to be secured with stable, firm strength and the capacitor to be easily built-in.

DETAILED DESCRIPTION OF THE PREFERRED EMBODIMENTS

Figure 1:
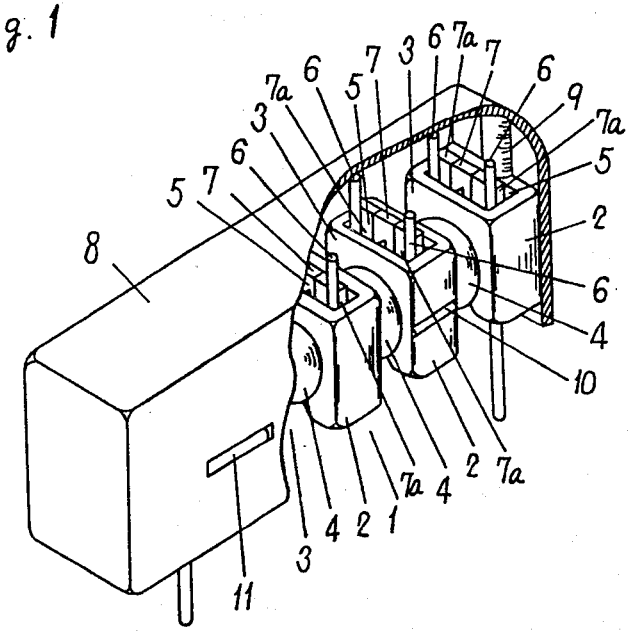
FIG. 1 is a partially broken-away perspective view of an LC composite component in one embodiment of the present invention.
Figure 2:
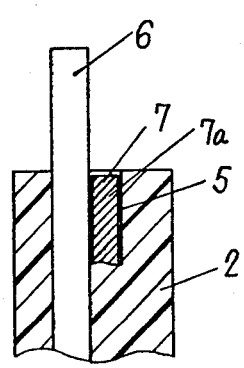
FIG. 2 is an enlarged cross-sectional view of the essential portion thereof.

In the description of the embodiment shown in FIG. 1 and FIG. 2, reference numeral 1 is a synthetic-resin coaxial bobbin, which has a plurality of collars 2 disposed at equal intervals and has a plurality of winding grooves 3 formed between the collars 2, coils 4 being wound in the winding grooves 3. Also, a concave recess 5 is provided in the top face of the collar 2. Terminal pins 6 are planted so as to upwardly project, respectively, from both ends of the concave recess 5. A leadless tip type of square-shaped capacitor 7 such as a ceramic capacitor with upwardly projecting electrodes 7a at its both ends is accommodated in the concave recess 5 with the terminal pins 6 being planted therein. The capacitor 7 is secured through electric and mechanical connection of the electrodes 7a to the terminal pins 6 by means of soldering or the like at the open end of concave recess 5. A case 8 made of metal or the like is put on the coil 4, the coaxial bobbin 1 with the capacitor 7 being built therein. Engagement projections 9, which are provided respectively on the inner faces of both sides of the case 8, come into contact with the top faces of the collars 2 located on both ends of the coaxial bobbin 1 to perform their positioning operations to prevent the ceiling face of the case 8 from coming into contact with the terminal pin 6. Inward engagement projections 11 which are provided on the front face and the reverse face of the case 8 project into grooves 10 extending in horizontal directions in the front faces and the reverse faces of collars 2 so as to engage collars 2, thereby to connect the coaxial bobbin 1 with the case 8.

Although not shown, the lead wire of the coil 4 is wound and soldered around the necessary terminal pin 6 so that the coil 4 and the capacitor 7 may be connected with each other.

Also, the depth of the concave recess 5 is the same as the height of the capacitor 7 in the embodiment of FIG. 2. In another embodiment shown in FIG. 3, the depth of the concave recess 5, wherein the capacitor 7 is upwardly projected by approximately one third of the capacitor height, causes one portion of the connecting location between the electrode 7a of the capacitor 7 and the terminal pin 6 to be exposed externally from the concave recess 5 so that, when the electrode 7a of the capacitor 7 is soldered to the terminal pin 6, the solder can readily be attached to the electrode 7a of the capacitor and the terminal pin 6, thus ensuring a better soldering operation. Since heat applied to the coaxial bobbin 1 can be made smaller in amount during the soldering operation the coaxial bobbin 1, which is made of synthetic resin, can be prevented from being deformed.

Figure 3:
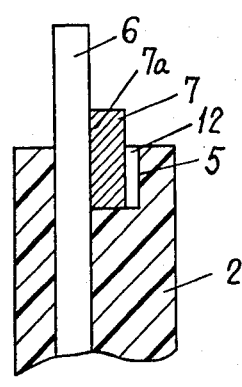
FIG. 3 is an enlarged cross-sectional view of the essential portion in the other embodiment.
Figure 4:
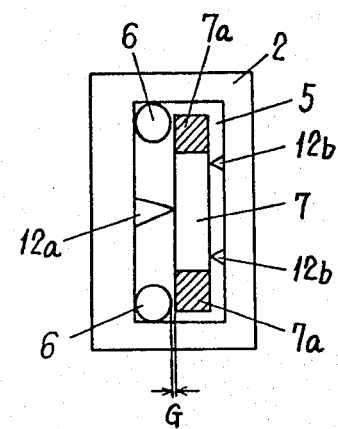
FIG. 4 is a top plan view of the essential portion thereof.

In addition, a few ribs 12, including ribs 12a and 12b, which are adapted to position and retain the capacitor 7, can be provided within the concave recess 5 as shown in FIG. 3 and FIG. 4. Ribs 12 permit capacitor 7 to be pressure-inserted and retained in concave recess 5. A small gap G, which is 0.2 mm or less, between the terminal pin 6 and the capacitor 7 is provided so that the soldering operation on the inner rear of the capacitor 7 can be completed.

This gap is maintained by rib 12a on the side of the terminal pin 6 which is formed larger than the two ribs 12b on the side of the capacitor 7. The tip end of the larger rib 12b projects from the terminal pin 6 onto the side of the capacitor 7 so that the capacitor 7 does not directly contact the terminal pin 6. Elasticity is thereby provided in the retention of the capacitor 7 and variations in the size of the capacitor 7 can be sufficiently absorbed.

Figure 5:
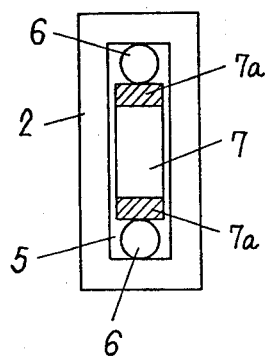
FIG. 5 and FIG. 6 are enlarged top plan views showing the essential portion thereof in still other embodiments.
Figure 6:
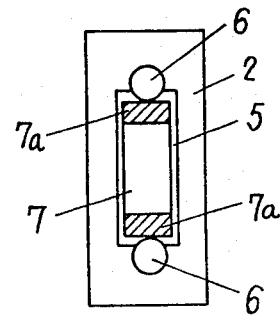

In addition, a capacitor 7 may be pressure-inserted during construction, between the two terminal pins 6 as shown in FIG. 5 and FIG. 6. Also, as shown in FIG. 6, the greater portion of the terminal pin 6 may be embedded in the coaxial bobbin 1. The terminal pin may be planted so that only one portion of the terminal pin 6 is exposed from the end face of the concave recess 5.

INDUSTRIAL APPLICABILITY

According to the LC composite component of the present invention as described hereinabove, the size thereof can be made smaller, since a tip type of capacitor is accommodated in the concave recess of the collar of each coaxial bobbin. Furthermore, since the electrodes of the capacitor can be directly soldered on the terminal pin, the fixing of the capacitor becomes more stable and stronger, the quality can be improved, and the assembling operation can be performed more easily and can be effected by an automatic machine.

What is claimed is:

1. An LC composite component comprising: a coaxial bobbin, a plurality of collars thereon defining winding grooves therebetween, coils wound in the winding grooves, each collar having a concave recess therein, open at a top end thereof, terminal pins projecting upwardly from the opposite ends of the concave recess, a leadless tip type capacitor having upwardly projecting electrodes accommodated in the concave recess and the coils and the capacitor electrodes being connected with each other by said terminal pins, said capacitor electrodes being connected to said terminal pin at said open end of the concave recess of said each collar.

2. An LC composite component as claimed in claim 1, wherein the capacitor electrodes project from the respective concave recesses of said collars.

3. An LC composite component in accordance with claim 1, in which each collar has ribs extending into said concave recess for elastically retaining the capacitor therein.

* * * * *